(12) United States Patent
Eun et al.

(10) Patent No.: US 12,506,251 B2
(45) Date of Patent: Dec. 23, 2025

(54) ANTENNA MODULE HAVING A SUB-ANTENNA ON A PRINTED CIRCUIT BOARD

(71) Applicant: LG INNOTEK CO., LTD., Seoul (KR)

(72) Inventors: Sang Ki Eun, Seoul (KR); Jeong Hun Chang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 225 days.

(21) Appl. No.: 18/255,239

(22) PCT Filed: Jan. 11, 2022

(86) PCT No.: PCT/KR2022/000461
§ 371 (c)(1),
(2) Date: May 31, 2023

(87) PCT Pub. No.: WO2022/149950
PCT Pub. Date: Jul. 14, 2022

(65) Prior Publication Data
US 2024/0097312 A1    Mar. 21, 2024

(30) Foreign Application Priority Data
Jan. 11, 2021   (KR) .................. 10-2021-0003067

(51) Int. Cl.
*H01Q 1/22* (2006.01)
(52) U.S. Cl.
CPC ................ *H01Q 1/2283* (2013.01)

(58) Field of Classification Search
CPC ..... H01Q 1/2283; H01Q 1/242; H01Q 1/2783
(Continued)

(56) References Cited

U.S. PATENT DOCUMENTS 6,982,879 B1    1/2006  Franca-Neto et al.
8,557,629 B1 *  10/2013 Kim ................. H01L 25/105
                                                438/106
(Continued)

FOREIGN PATENT DOCUMENTS

CN    111048478 A    4/2020
JP    2008-259250 A  10/2008
(Continued)

OTHER PUBLICATIONS

International Search Report dated Apr. 19, 2022 in International Application No. PCT/KR2022/000461.
(Continued)

*Primary Examiner* — Peguy Jean Pierre
(74) *Attorney, Agent, or Firm* — SALIWANCHIK, LLOYD & EISENSCHENK

(57) ABSTRACT

An antenna module comprises: a first printed circuit board including a circuit pattern; an IC chip disposed on the first printed circuit board; a solder part disposed on the first printed circuit board; a dielectric layer disposed on the first printed circuit board and surrounding the IC chip and the solder part; and an antenna patterned on the upper surface of the dielectric layer and connected to the solder part, wherein at least a portion of the solder part protrudes up higher than the upper surface of the dielectric layer.

18 Claims, 4 Drawing Sheets

(58) Field of Classification Search
USPC .......................................................... 343/702
See application file for complete search history.

(56) References Cited

U.S. PATENT DOCUMENTS

| | | |
|---|---|---|
| 9,754,851 B2 | 9/2017 | Auchere et al. |
| 10,411,329 B2 | 9/2019 | Cardinali et al. |
| 10,734,704 B2 | 8/2020 | Ho et al. |
| 2012/0228011 A1* | 9/2012 | Chang .................... H01L 24/13 |
| | | 174/257 |
| 2017/0154859 A1* | 6/2017 | Yap ......................... H01L 23/66 |
| 2017/0207524 A1 | 7/2017 | Cardinali et al. |
| 2018/0309187 A1 | 10/2018 | Auchere et al. |
| 2020/0118912 A1 | 4/2020 | Ho et al. |
| 2020/0413544 A1 | 12/2020 | Gao et al. |
| 2022/0071022 A1* | 3/2022 | Kong ..................... H05K 1/183 |

FOREIGN PATENT DOCUMENTS

| | | |
|---|---|---|
| JP | 2009-188714 A | 8/2009 |
| JP | 2020-28326 A | 2/2020 |
| KR | 10-2005-0043701 A | 5/2005 |
| KR | 10-2016-0067961 A | 6/2016 |
| KR | 10-2016-0087747 A | 7/2016 |
| KR | 10-2018-0128067 A | 11/2018 |
| WO | 02/093685 A1 | 11/2002 |

OTHER PUBLICATIONS

Supplementary European Search Report dated Jun. 25, 2024 in European Application No. 22736927.9.
Office Action dated Jul. 1, 2025 in Japanese Application No. 2023-532223.

* cited by examiner

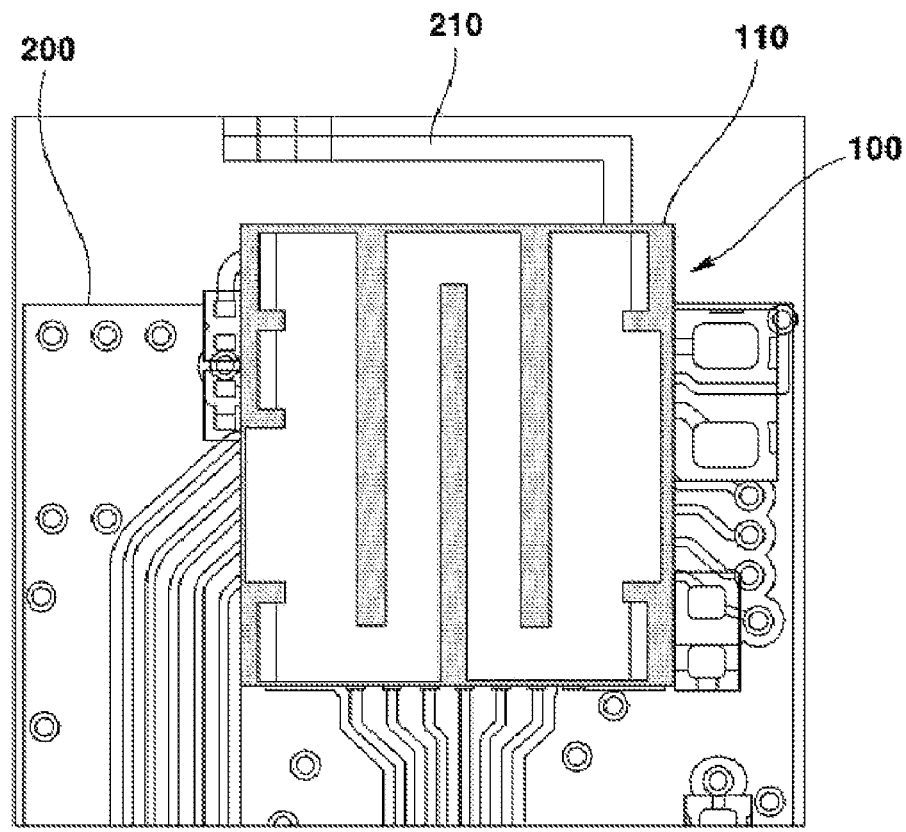

ANTENNA MODULE HAVING A SUB-ANTENNA ON A PRINTED CIRCUIT BOARD

CROSS-REFERENCE TO RELATED APPLICATIONS

This application is the U.S. national stage application of International Patent Application No. PCT/KR2022/000461, filed Jan. 11, 2022, which claims the benefit under 35 U.S.C. § 119 of Korean Application No. 10-2021-0003067, filed Jan. 11, 2021, the disclosures of each of which are incorporated herein by reference in their entirety.

TECHNICAL FIELD

The present invention relates to an antenna module.

BACKGROUND ART

With the development of mobile communication technology, electronic devices equipped with antennas such as smartphones and wearable devices are widely distributed. Such an electronic device may wirelessly transmit and receive data (for example: a message, a picture, a video, a music file, or a game) through an antenna.

In general, Bluetooth technology is a communication means that can replace mechanically weak and inconvenient wired cables between communication devices through one wireless connection within a short range. This enables voice communication, including immediate networking and data communication with small mobile devices such as mobile phones and PDAs, while its application ranges from cell phones, wireless headsets and LAN access points to printers, desktops, fax machines, keyboards, digital cameras, digital camcorders, joysticks, PDAs, and the like, and is expanding to virtually all digital devices.

Such a Bluetooth module is configured in the form of a small printed circuit board (PCB) equipped with an RF processing module, a baseband processor, a flash memory, and peripheral circuits and antennas thereof so as to be easily mounted on a main board.

In order to transmit a signal processed by an RF processing module in the module, as for the Bluetooth module, there is a type in which an antenna is included in a Bluetooth module, a planar inverted-F antenna (PIFA) type in which an antenna is provided inside a PCB, or a type in which a chip antenna is applied on a PCB.

DETAILED DESCRIPTION OF THE INVENTION

Technical Subject

The present embodiment is to provide an antenna module that can be miniaturized and has improved radiation efficiency.

Technical Solution

An antenna module according to the present embodiment comprises: a first printed circuit board including a circuit pattern; an IC chip being disposed on the first printed circuit board; a solder part being disposed on the first printed circuit board; a dielectric layer being disposed on the first printed circuit board and surrounding the IC chip and the solder part; and an antenna being patterned on an upper surface of the dielectric layer and connected to the solder part, wherein at least a portion of the solder part is protruded more upward than the upper surface of the dielectric layer.

The up and down height of the solder part may be greater than the thickness of the dielectric layer.

The material of the dielectric layer may include a resin.

An RF element being disposed inside the dielectric layer and soldered on the first printed circuit board to generate a frequency may be included.

At least one electronic component may be disposed on the first printed circuit board, and the antenna may be disposed not to be overlapped with the electronic component in an up and down direction.

The antenna may have a region bent at least once.

The antenna may have regions being disposed perpendicular to each other between adjacent regions.

A second printed circuit board being disposed below the first printed circuit board is included, a sub-antenna is disposed on the second printed circuit board adjacent to the first printed circuit board, and the sub-antenna may be electrically connected to the solder part.

The sub-antenna may be electrically connected to the solder part.

The thickness of the sub-antenna may correspond to a sum of the thicknesses of the dielectric layer and the first printed circuit board.

Advantageous Effects

Through the present embodiment, radiation efficiency can be increased by arranging the antenna outside the dielectric layer, and there is an advantage of securing a wider component arrangement space on a printed circuit board.

BRIEF DESCRIPTION OF DRAWINGS

FIGS. 6 and 7 are diagrams illustrating a modified embodiment of an antenna module according to an embodiment of the present invention.

BEST MODE

Hereinafter, preferred embodiments of the present invention will be described in detail with reference to the accompanying drawings.

However, the technical idea of the present invention is not limited to some embodiments to be described, but may be implemented in various forms, and inside the scope of the technical idea of the present invention, one or more of the constituent elements may be selectively combined or substituted between embodiments.

In addition, the terms (including technical and scientific terms) used in the embodiments of the present invention, unless explicitly defined and described, can be interpreted as a meaning that can be generally understood by a person skilled in the art, and commonly used terms such as terms defined in the dictionary may be interpreted in consideration of the meaning of the context of the related technology.

In addition, terms used in the present specification are for describing embodiments and are not intended to limit the present invention.

In the present specification, the singular form may include the plural form unless specifically stated in the phrase, and when described as "at least one (or more than one) of A and B and C", it may include one or more of all combinations that can be combined with A, B, and C.

In addition, in describing the components of the embodiment of the present invention, terms such as first, second, A, B, (a), and (b) may be used. These terms are merely intended to distinguish the components from other components, and the terms do not limit the nature, order or sequence of the components.

And, when a component is described as being 'connected', 'coupled' or 'interconnected' to another component, the component is not only directly connected, coupled or interconnected to the other component, but may also include cases of being 'connected', 'coupled', or 'interconnected' due that another component between that other components.

In addition, when described as being formed or arranged in "on (above)" or "below (under)" of each component, "on (above)" or "below (under)" means that it includes not only the case where the two components are directly in contact with, but also the case where one or more other components are formed or arranged between the two components. In addition, when expressed as "on (above)" or "below (under)", the meaning of not only an upward direction but also a downward direction based on one component may be included.

Figure 1:
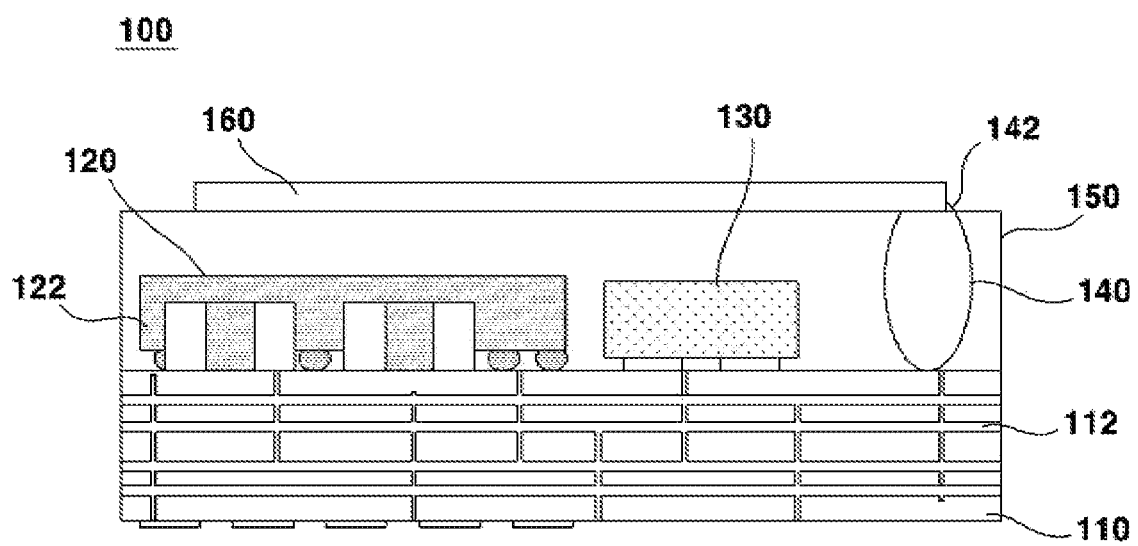
FIG. 1 is a cross-sectional view of an antenna module according to an embodiment of the present invention.
Figure 2:
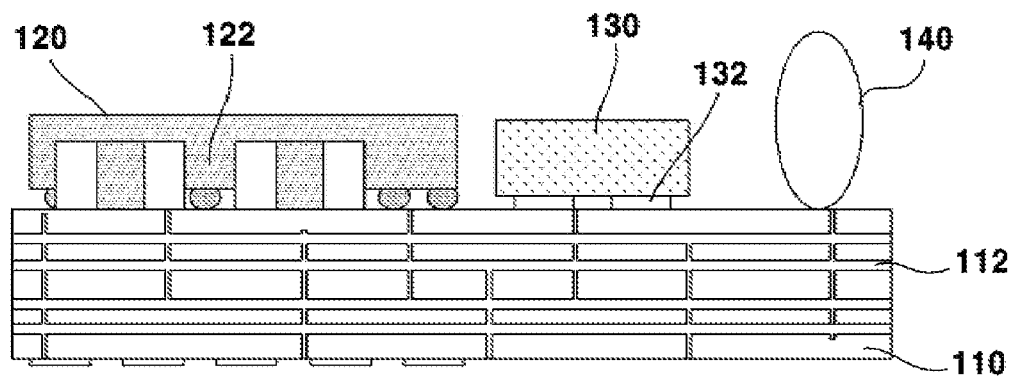
FIGS. 2 and 3 are cross-sectional views illustrating a manufacturing process of an antenna module according to an embodiment of the present invention.
Figure 3:
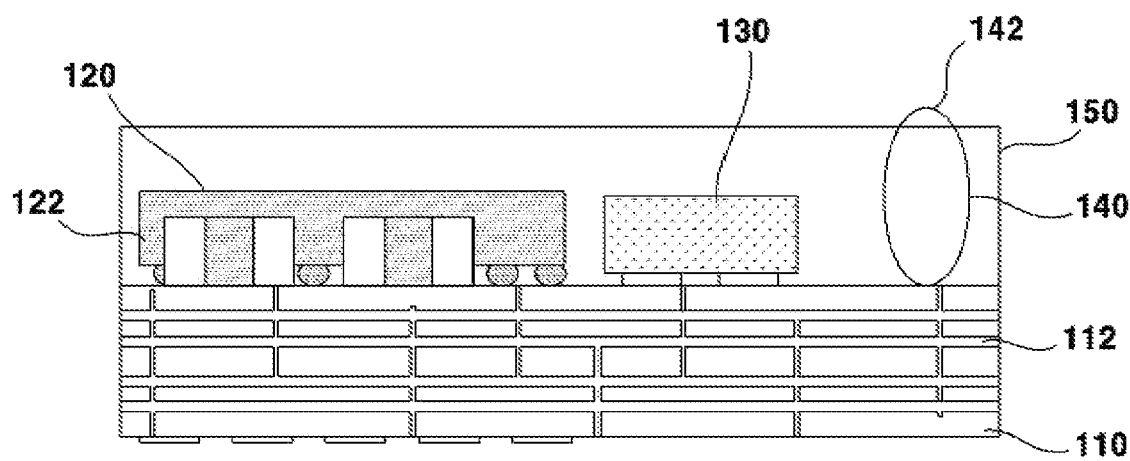

FIG. 1 is a cross-sectional view of an antenna module according to an embodiment of the present invention; and FIGS. 2 and 3 are cross-sectional views illustrating a manufacturing process of an antenna module according to an embodiment of the present invention.

Referring to FIGS. 1 to 3, an antenna module 100 according to an embodiment of the present invention may include a printed circuit board 110, an IC chip 120, an RF element 130, a solder part 140, a dielectric layer 150, and an antenna 160.

The printed circuit board 110 is formed in a plate shape, and the IC chip 120, the RF element 130, the solder part 140, and the dielectric layer 150 may be disposed on an upper surface thereof. In the printed circuit board 110, a wiring 112 being patterned with a circuit and a ground (not shown) are disposed and electrically connected with the IC chip 120, the RF element 130, and the antenna 160 through the wiring 112 and the ground to enable the processing of communication signals.

The IC chip 120 and the RF element 130 may be mounted on the printed circuit board 110 to process communication signals. For example, the antenna module 100 may communicate through the IC chip 120 using a Bluetooth method. The RF element 130 may include a crystal and generate a frequency for communication.

The IC chip 120 may be soldered on the printed circuit board 110. The IC chip 120 may include at least one leg part 122. The leg part 122 is protruded more downward than other regions, and a lower surface thereof may be soldered on the printed circuit board 110.

The RF element 130 may be disposed on the printed circuit board 110 being spaced apart from the IC chip 120. Similarly, the RF element 130 is soldered on an upper surface of the printed circuit board 110 through a leg part 132 and may be electrically connected to the printed circuit board 110.

The lower end of the solder part 140 is disposed on an upper surface of the printed circuit board 110, and the upper end thereof may be coupled with the antenna 160. The solder part 140 may electrically connect the antenna 160 on the printed circuit board 110. The solder part 140 may be a region soldered on the printed circuit board 110.

The dielectric layer 150 may be disposed on the printed circuit board 110. The dielectric layer 150 has a predetermined thickness and may be disposed to surround the IC chip 120, the RF element 130, and the solder part 140. The IC chip 120, the RF element 130, and the solder part 140 may be firmly fixed on the printed circuit board 110 through the dielectric layer 150. The dielectric layer 150 may be called a molding part in that it is molded on the printed circuit board 110. The material of the dielectric layer 150 may include resin.

The antenna 160 may be disposed on an upper surface of the dielectric layer 150. The antenna 160 may have a plate shape made of metal. The antenna 160 may be patterned with a conductive material on an upper surface of the dielectric layer 150. The antenna 160 may be designed to have a resonance length corresponding to each frequency band according to the frequency band signal being processed in the printed circuit board 110.

The antenna 160 may be electrically connected to the printed circuit board 110 through the solder part 140. To this end, the vertical height of the solder part 140 being defined from the upper end to the lower end of the solder part 140 may be longer than the thickness of the dielectric layer 150. At least a portion of the solder part 140 may be disposed to be protruded upward from an upper surface of the dielectric layer 150. A portion of an upper end of the solder part 140 may be protruded upward from the dielectric 150. Thus, the solder part 140 may be electrically connected to the antenna 160, and the antenna 160 and the printed circuit board 110 may be electrically connected through the solder part 140.

According to the above structure, radiation efficiency can be increased by disposing the antenna 160 outside the dielectric layer 150, and there is an advantage in securing a wider component arrangement space on the printed circuit board 110 by not arranging the antenna 160 directly on the printed circuit board 100.

Describing the manufacturing process of the antenna module 100, as shown in FIG. 2, after mounting the IC chip 120, the RF element 130, and the solder part 140 on the printed circuit board 110, the dielectric layer 150 is formed as shown in FIG. 3. As described above, the dielectric layer 150 may be formed on the printed circuit board 110 through molding. Then, by electrically connecting the antenna 160 to the region of the solder part 140 being protruded upward from the dielectric layer 150, the antenna 160 may be disposed on an upper surface of the dielectric layer 150.

Figure 4:
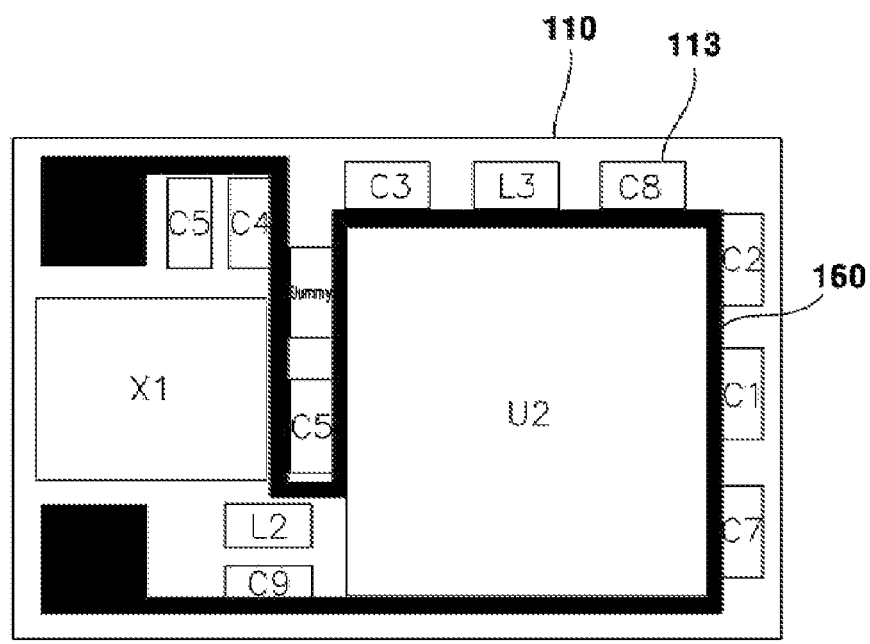
FIG. 4 is a plan view illustrating an antenna arrangement structure on a printed circuit board according to an embodiment of the present invention.
Figure 5:
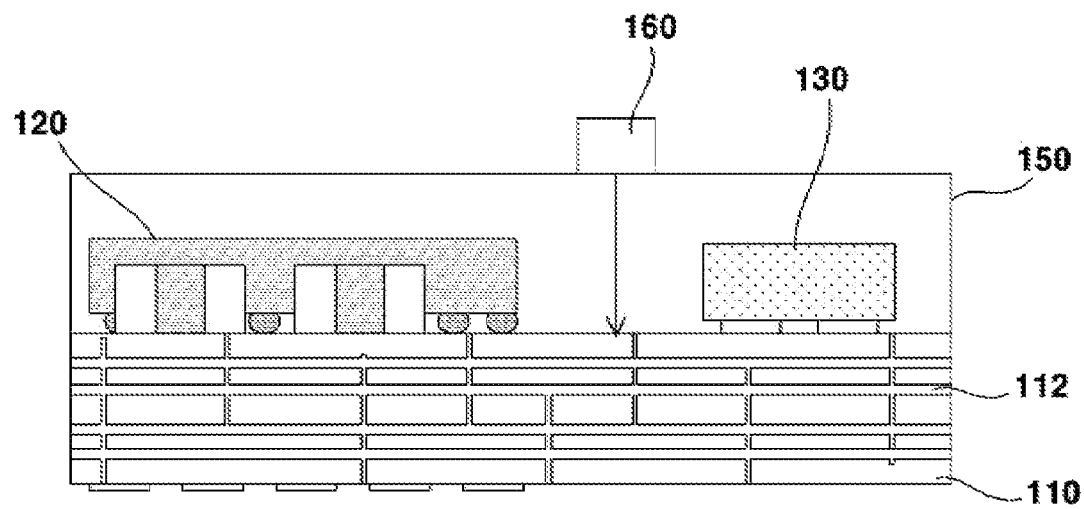
FIG. 5 is a cross-sectional view illustrating an antenna module according to an embodiment of the present invention from another angle.

FIG. 4 is a plan view illustrating an antenna arrangement structure on a printed circuit board according to an embodiment of the present invention; and FIG. 5 is a cross-sectional view illustrating an antenna module according to an embodiment of the present invention from another angle.

Referring to FIGS. 4 and 5, at least one electronic component 113 for driving the antenna module 100 may be disposed on the printed circuit board 110. The antenna 160 may be disposed so as not to be overlapped in an up and down direction in order to maximize the separation distance from the electronic component 113. To this end, the antenna 160 may have a region bent at least once. The antenna 160 may have regions being disposed perpendicular to each other between adjacent regions. Accordingly, since the separation distance between the antenna 160 and the electronic component 113 can be maximally increased, there is an advantage in inhibiting the electrical characteristics of the electronic components 113 from being deteriorated or changed.

Figure 6:
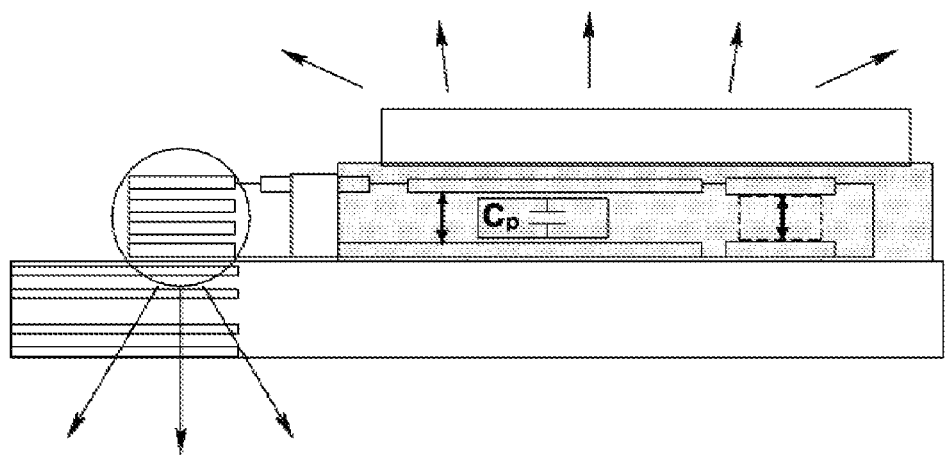

FIGS. 6 and 7 are diagrams illustrating a modified embodiment of an antenna module according to an embodiment of the present invention.

Referring to FIGS. 6 and 7, the antenna module 100 may further include another printed circuit board 200. Accordingly, the printed circuit board 110 may be referred to as a first printed circuit board, and the other printed circuit board 200 may be referred to as a second printed circuit board.

The second printed circuit board 200 is disposed below the first printed circuit board 110, and the lower surface of the first printed circuit board 110 may be soldered to the upper surface of the second printed circuit board 200. The second printed circuit board 200 has a cross-sectional area larger than that of the first printed circuit board 110, and a plurality of electronic components may be disposed on an upper surface thereof.

Meanwhile, a sub-antenna 210 may be disposed at an outer side of the first printed circuit board 110 among the upper surface of the second printed circuit board 200. The sub-antenna 210 is electrically connected to the wiring 112 inside the first printed circuit board 110 and may have a predetermined thickness. The sub-antenna 210 may be electrically connected to the solder part 140. Accordingly, a current path of the antenna module 100 can be extended through the sub-antenna 210. For an example, the antenna module 100 may be designed to transmit and receive signals in the 2.4 GHz band through the sub-antenna 210 after adjusting to a frequency in the 2.7 GHz to 3 GHz band through the antenna 160.

The sub-antenna 210 may have a region bent one or more times. The thickness of the sub-antenna 210 may correspond to the thickness of the dielectric layer 150 or may correspond to the sum of the thicknesses of the dielectric layer 150 and the first printed circuit board 110.

According to the structure as described above, the antenna module 100 has an advantage in that radiation can be performed not only upwardly through the antenna 160 but also downwardly through the sub-antenna 210.

In the above description, it is described that all the components constituting the embodiments of the present invention are combined or operated in one, but the present invention is not necessarily limited to these embodiments. In other words, within the scope of the present invention, all of the components may be selectively operated in combination with one or more. In addition, the terms "comprise", "include" or "having" described above mean that the corresponding component may be inherent unless specifically stated otherwise, and thus it should be construed that it does not exclude other components, but further include other components instead. All terms, including technical and scientific terms, have the same meaning as commonly understood by one of ordinary skill in the art unless otherwise defined. Terms used generally, such as terms defined in a dictionary, should be interpreted to coincide with the contextual meaning of the related art, and shall not be interpreted in an ideal or excessively formal sense unless explicitly defined in the present invention.

The above description is merely illustrative of the technical idea of the present invention, and those skilled in the art to which the present invention pertains may make various modifications and changes without departing from the essential characteristics of the present invention. Therefore, the embodiments disclosed in the present invention are not intended to limit the technical idea of the present invention but to describe the present invention, and the scope of the technical idea of the present invention is not limited by these embodiments. The protection scope of the present invention should be interpreted by the following claims, and all technical ideas within the equivalent scope should be interpreted as being included in the scope of the present invention.

The invention claimed is:

1. An antenna module comprising:
a first printed circuit board including a circuit pattern;
a second printed circuit board disposed below the first printed circuit board;
an IC chip disposed on the first printed circuit board;
a solder part disposed on the first printed circuit board;
a dielectric layer disposed on the first printed circuit board and surrounding the IC chip and the solder part; and
an antenna patterned on an upper surface of the dielectric layer and connected to the solder part,
wherein at least a portion of the solder part is protruded more upward than an upper surface of the dielectric layer,
wherein a height of the solder part is greater than a thickness of the dielectric layer, and
wherein a sub-antenna is disposed on the second printed circuit board adjacent to the first printed circuit board.

2. The antenna module according to claim 1,
wherein the IC chip is a Bluetooth communication chip.

3. The antenna module according to claim 1,
wherein the material of the dielectric layer includes a resin.

4. The antenna module according to claim 1, including:
An RF element being disposed inside the dielectric layer and soldered on the first printed circuit board and configured to generate a frequency.

5. The antenna module according to claim 1,
wherein at least one electronic component is disposed on the first printed circuit board, and
wherein the antenna is disposed not to be overlapped with the electronic component in a vertical direction.

6. The antenna module according to claim 5,
wherein the antenna has a region bent at least once.

7. The antenna module according to claim 5,
wherein the antenna has regions disposed perpendicular to each other between adjacent regions.

8. The antenna module according to claim 1,
wherein the sub-antenna is electrically connected to the solder part.

9. The antenna module according to claim 1,
wherein a thickness of the sub-antenna corresponds to a sum of thicknesses of the dielectric layer and the first printed circuit board.

10. The antenna module according to claim 1, wherein a cross-sectional area of the second printed circuit board is larger than a cross-sectional area of the first printed circuit board.

11. The antenna module according to claim 1, wherein the sub-antenna is disposed not to overlap with the first printed circuit board in a vertical direction.

12. The antenna module according to claim 1, wherein the sub-antenna has a region bent more than once.

13. The antenna module according to claim 1, wherein a thickness of the sub-antenna corresponds to the thickness of the dielectric layer.

14. The antenna module according to claim 1, wherein the antenna is connected to a region of the solder part protruding upward from the dielectric layer.

15. An antenna module comprising:
- a first printed circuit board;
- a second printed circuit board disposed below the first printed circuit board;
- an IC chip disposed on the first printed circuit board;
- a solder part disposed on the first printed circuit board;
- a dielectric layer disposed on the first printed circuit board and surrounding the IC chip and the solder part; and
- an antenna disposed on an upper surface of the dielectric layer and connected to the solder part,
- wherein a height of the solder part is greater than a thickness of the dielectric layer,
- wherein a sub-antenna is disposed on the second printed circuit board adjacent to the first printed circuit board, and
- wherein the sub-antenna is electrically connected to the solder part.

16. The antenna module according to claim 15, including:
- an RF element disposed inside the dielectric layer and soldered on the first printed circuit board and configured to generate a frequency.

17. The antenna module according to claim 15,
- wherein at least one electronic component is disposed on the first printed circuit board, and
- wherein the antenna is disposed not to be overlapped with the electronic component in a vertical direction.

18. The antenna module according to claim 15,
- wherein the antenna has a region bent at least once.

* * * * *